United States Patent
Jeong et al.

(10) Patent No.: US 7,901,786 B2
(45) Date of Patent: Mar. 8, 2011

(54) METHOD FOR MANUFACTURING ULTRA-HYDROPHILIC THIN FILM COATED METAL PRODUCT, AND ULTRA-HYDROPHILIC THIN FILM COATED METAL PRODUCT

(75) Inventors: Young-Man Jeong, Ginhae-shi (KR); Jung-Geon Oll, Changwon-shi (KR); Hyun-Woo Jun, Changwon-shi (KR); Su-Won Lee, Changwon-shi (KR); Druk-Hyun Youn, Anyang-shi (KR)

(73) Assignee: LG Electronics, Inc., Seoul (KR)

( * ) Notice: Subject to any disclaimer, the term of this patent is extended or adjusted under 35 U.S.C. 154(b) by 0 days.

(21) Appl. No.: 12/543,377

(22) Filed: Aug. 18, 2009

(65) Prior Publication Data

US 2010/0028663 A1    Feb. 4, 2010

Related U.S. Application Data

(62) Division of application No. 11/547,467, filed on Apr. 18, 2007.

(30) Foreign Application Priority Data

Apr. 6, 2004    (KR) .................. 10-2004-0023446

(51) Int. Cl.
*B32B 15/04* (2006.01)
(52) U.S. Cl. ......... 428/448; 428/650; 428/469; 428/686; 428/450; 428/336; 428/446
(58) Field of Classification Search .................. None
See application file for complete search history.

(56) References Cited

U.S. PATENT DOCUMENTS

| 4,737,415 A | 4/1988 | Ichijo et al. |
| 5,190,807 A | 3/1993 | Kimock et al. |
| 5,702,770 A | 12/1997 | Martin |
| 6,007,875 A | 12/1999 | Grunwald et al. |
| 6,027,766 A | 2/2000 | Greenberg et al. |
| 6,074,981 A | 6/2000 | Tada et al. |
| 6,297,175 B1 | 10/2001 | Iyer |
| 6,472,088 B2 | 10/2002 | Nakamura et al. |
| 6,673,433 B1 * | 1/2004 | Saeki et al. ................. 428/323 |
| 6,749,813 B1 | 6/2004 | David et al. |

(Continued)

FOREIGN PATENT DOCUMENTS

CN    1420207 A    5/2003

(Continued)

OTHER PUBLICATIONS

Da Cruz et al., Properties of Titanium Oxide Film Obtained by PECVD, Surface and Coatings Technology, 126 (2000) pp. 123-130.

*Primary Examiner* — Jennifer C McNeil
*Assistant Examiner* — Vera Katz
(74) *Attorney, Agent, or Firm* — Birch Stewart Kolasch & Birch, LLP

(57) ABSTRACT

A method for manufacturing an ultra-hydrophilic thin film coated metal product having excellent hydrophilic properties, aging properties and corrosion resistance in an industrial scale production wherein the thin film includes an HMDSO anticorrosive thin film selectively formed on both surfaces of a metal substrate sheet, and an ultra-hydrophilic Ti—O—(C)—(H) group compound thin film is coated on the anticorrosive thin film. The metal substrate sheet is mechanically processed into a target shape.

7 Claims, 10 Drawing Sheets

U.S. PATENT DOCUMENTS

| | | |
|---|---|---|
| 6,835,688 B2 | 12/2004 | Morikawa et al. |
| 6,911,139 B2 * | 6/2005 | Heimann et al. ............... 205/316 |
| 2001/0026859 A1 | 10/2001 | Nakamura et al. |
| 2002/0041967 A1 | 4/2002 | Nakamura et al. |
| 2002/0098345 A1 | 7/2002 | Kamo et al. |
| 2002/0155299 A1 | 10/2002 | Harris et al. |
| 2002/0169076 A1 | 11/2002 | Takeshi et al. |
| 2003/0209290 A1 * | 11/2003 | Heimann et al. ............... 148/245 |
| 2005/0003644 A1 | 1/2005 | Remington et al. |
| 2005/0129935 A1 * | 6/2005 | Kunitake et al. ............... 428/336 |
| 2005/0170716 A1 | 8/2005 | Ylitalo |
| 2005/0266248 A1 | 12/2005 | Millero et al. |
| 2007/0040278 A1 | 2/2007 | Furuya |
| 2007/0186643 A1 | 8/2007 | Speldrich et al. |
| 2010/0028663 A1 | 2/2010 | Jeong et al. |

FOREIGN PATENT DOCUMENTS

| | | |
|---|---|---|
| EP | 0 857 518 A1 | 8/1998 |
| GB | 2 350 841 A | 12/2000 |
| JP | 8-49085 A | 2/1996 |
| JP | 10-317178 A | 12/1998 |
| JP | 2001-280879 A | 10/2001 |
| KR | 2002-0083273 A | 11/2002 |
| KR | 2002-0088029 A | 11/2002 |
| KR | 2003-030755 A | 4/2003 |
| WO | WO-99-28530 A1 | 6/1999 |
| WO | WO-2004/014986 A1 | 2/2004 |

\* cited by examiner

METHOD FOR MANUFACTURING ULTRA-HYDROPHILIC THIN FILM COATED METAL PRODUCT, AND ULTRA-HYDROPHILIC THIN FILM COATED METAL PRODUCT

This application is a Divisional of co-pending application Ser. No. 11/547,467, filed on Apr. 18, 2007 and application Ser. No. 11/547,467 claims priority under 35 USC 119 to Patent Application No. 10-2004-0023446 filed in Korea on Apr. 6, 2004, all of which are hereby expressly incorporated by reference in their entirety.

TECHNICAL FIELD

The present invention relates to a method for manufacturing an ultra-hydrophilic thin film coated metal product, and an ultra-hydrophilic thin film coated metal product.

BACKGROUND ART

Metal materials having hydrophilic surface layers on their surfaces have been efficiently used in the whole industrial fields, which will now be explained by using a heat exchanger as an example.

A heat exchanger exchanging heat by making two fluids having different temperatures directly or indirectly contact each other has been widely used in various industrial fields, especially for heating, air conditioning, power generation, waste heat recovery and chemical processes.

An air conditioning heat exchanger forms a fin that is an enlarged surface at the air side to improve heat transmission. When the air having humidity passes through the fin in the heat exchange operation, heat transmission occurs by low temperature refrigerants supplied into a tube. When a temperature of the surface of the fin is equal to or lower than a dew point temperature of the air having humidity, droplets are formed on the surface of the heat exchanger to intercept flow of the air, which increases a pressure drop that is a pressure difference between the inlet and outlet of the heat exchanger. Accordingly, power of a fan must be increased to supply the same flux, which results in large power consumption.

In order to solve the above problem, as disclosed in Japanese Laid-Open Patent Application 61-8598, flow of condensed water formed on a surface of a fin of a heat exchanger is improved by performing an anti-corrosive process on an aluminum sheet of the fin by using $Cr^{+6}$ to improve corrosion resistance, and performing a silicate-group coating process thereon to give hydrophilicity, which is called a pre-coated material (PCM).

The PCM basically requires $Cr^{+6}$ to obtain corrosion resistance. However, $Cr^{+6}$ will be prevented since 2006 due to environmental problems. There are thus increasing demands for a material substituting for $Cr^{+6}$. Until now, $Cr^{+3}$ or resin type has been suggested. In the preparation of the PCM, tetrachloroethane (TCE) inevitably used to wash aluminum also causes environmental contamination. In addition, the PCM showing excellent hydrophilic performance at an initial stage gradually loses the hydrophilic property, namely, has an aging characteristic. Recently, chemical products have been mostly used as materials for wallpaper. The silicate material for giving hydrophilicity is volatilized and chemically coupled with the wall paper, thereby discoloring the wall paper. Also, the volatilized materials displease people.

Continuous attempts have been made to satisfy various demands by forming a functional surface layer (for example, hydrophilicity or hydrophobicity) on the existing material. Exemplary methods for forming the functional surface layer include 1) depositing the functional surface layer on the existing material, and 2) giving new physical and chemical properties by improving the surface film of the existing material.

However, in the latter, as the time elapses, the surface property is changed and returns to the original property. For example, in the case that a metal such as aluminum is processed according to an ion beam assisted reaction process, hydrophilicity of the surface of the metal is improved. It is because a natural oxide film is etched on the surface of the aluminum and the functional film is formed thereon. As the time elapses, an oxide film is naturally grown on the surface of the aluminum. As a result, hydrophilicity improvement effects obtained by etching the natural oxide film are deteriorated. The functional film formed on the surface of the aluminum is made of an extremely thin layer (<a few nm) having very low mechanical resistance to environmental variations (water, temperature, etc.) by time. Accordingly, the improved hydrophilic property is reduced and returns to the original surface property.

In order to solve the foregoing problem, efforts have been continuously made to form on a metal material a hydrophilic or hydrophobic functional surface layer that can maintain a physically chemically stable state.

For example, as suggested in Japanese Laid-Open Patent Application 2001-280879, in a heat exchanger mounting a fin made of a conductive metal material on a metal tube that is a refrigerant passage, compound vapor containing titanium that is raw gas is supplied to flow in parallel to the surface of the fin of the heat exchanger in the air. Therefore, the heat exchanger coating the titanium dioxide thin film on the surface of the fin is manufactured according to a plasma CVD technology. The above patent application teaches that the heat exchanger can obtain excellent hydrophilic, antibacterial and deodorizing properties.

However, in a state where the fin is mounted on the tube to compose the heat exchanger, the titanium dioxide thin film is deposited on the fin of the heat exchanger. Thus, the titanium dioxide thin film cannot be uniformly deposited on the whole surface of the fin, which deteriorates hydrophilic and aging properties. Furthermore, productivity for direct application to the industrial production is not attained.

DISCLOSURE OF THE INVENTION

The present invention is achieved to solve the above problems. An object of the present invention is to provide a method for manufacturing an ultra-hydrophilic thin film coated metal product having excellent hydrophilic performance, aging property and corrosion resistance, and an ultra-hydrophilic thin film coated metal product.

Another object of the present invention is to easily produce ultra-hydrophilic thin films on an industrial production scale, by forming anticorrosive and ultra-hydrophilic thin films on a sheet-shaped metal substrate and mechanically processing the metal substrate into a target shape.

Yet another object of the present invention is to uniformly form anticorrosive and ultra-hydrophilic thin films on both surfaces of a sheet-shaped metal substrate.

Yet another object of the present invention is to continuously sequentially form anticorrosive and ultra-hydrophilic thin films on both surfaces of a sheet-shaped metal substrate.

In order to achieve the above-described objects of the invention, there is provided a method for manufacturing a ultra-hydrophilic thin film coated metal product, which continuously coats an anticorrosive thin film on both surfaces of a continuously-supplied sheet-shaped metal substrate in a vacuum chamber by using plasma, continuously coats a ultra-hydrophilic titanium compound thin film on both surfaces of the continuously-supplied sheet-shaped metal substrate on which the anticorrosive thin film has been coated in the vacuum chamber by using the plasma, and mechanically processes the metal sheet sequentially coated with the thin films into a target shape. Here, the anticorrosive thin film is a Si—O group compound thin film. The coating process of the anticorrosive thin film is performed by injecting reactive gas, gas-phase silicon precursor and carrier gas into the vacuum chamber. Preferably, the injection amount of the reactive gas, the gas-phase silicon precursor and the carrier gas ranges from 70 to 200 sccm, 700 to 1500 sccm and 700 to 2000 sccm, respectively.

The titanium compound thin film is a Ti—O group compound thin film. The titanium compound thin film further contains C and/or H. The coating process of the titanium compound thin film is performed by injecting reactive gas, gas-phase titanium precursor and carrier gas into the vacuum chamber. The injection amount of the reactive gas, the gas-phase titanium precursor and the carrier gas is 1500 sccm, 1000 sccm and 800 sccm, respectively. The gas injection ratio satisfies reactive gas:gas-phase titanium precursor:carrier gas=3:3:1.

The reactive gas is air or $O_2$. The carrier gas is at least one selected from the group consisting of He, $N_2$ and Ar. The total thickness of the anticorrosive thin film and the titanium compound thin film ranges from 1 to 200 nm.

The metal substrate is an aluminum substrate. The metal product is a fin for a heat exchanger.

There is also provided an ultra-hydrophilic thin film coated metal product, which is manufactured by sequentially plasma-coating an anticorrosive thin film on both surfaces and a titanium compound thin film on the anticorrosive thin film. The anticorrosive thin film is a Si—O group compound thin film. The anticorrosive thin film contains 15 to 22 atomic % of Si and 45 to 65 atomic % of O. The titanium compound thin film is a Ti—O group compound thin film. The titanium compound thin film contains 15 to 22 atomic % of Ti and 45 to 65 atomic % of O. The titanium compound thin film further contains C and/or H. In addition, the titanium compound thin film contains 15 to 22 atomic % of Ti and 45 to 65 atomic % of O, and further contains 20 to 25 atomic % of C and/or 20 to 25 atomic % of H.

The total thickness of the anticorrosive thin film and the titanium compound thin film ranges from 1 to 200 nm. The metal substrate is an aluminum substrate. The thin film coated metal sheet can be mechanically processed into a target shape.

BRIEF DESCRIPTION OF THE DRAWINGS

The present invention will become better understood with reference to the accompanying drawings which are given only by way of illustration and thus are not limitative of the present invention, wherein.

BEST MODE FOR CARRYING OUT THE INVENTION

A method for manufacturing a ultra-hydrophilic thin film coated metal product, and a ultra-hydrophilic thin film coated metal product in accordance with the present invention will now be described in detail with reference to the accompanying drawings.

Figure 1:
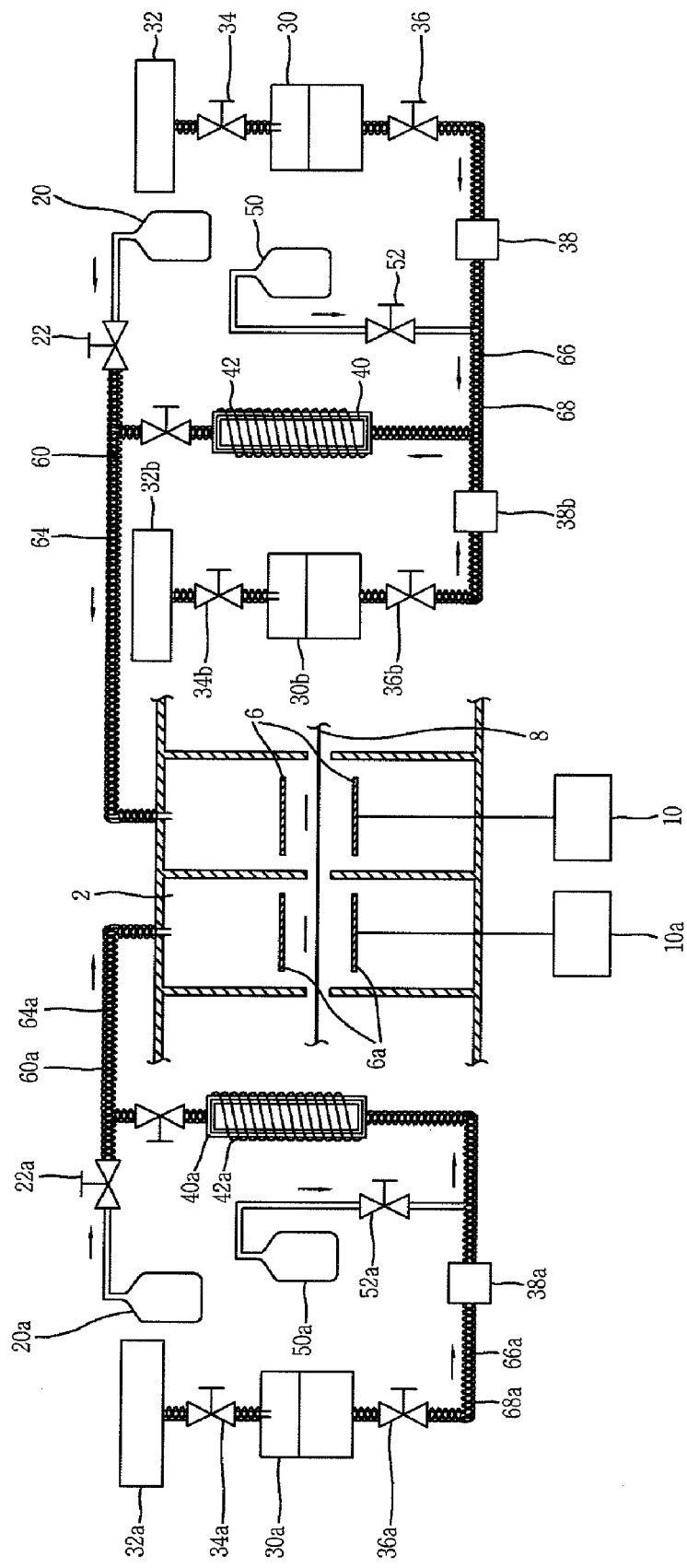
FIG. 1 is a concept view illustrating a device for continuously coating an anticorrosive thin film on a sheet-shaped metal substrate by using plasma, and continuously coating a ultra-hydrophilic titanium compound thin film on the sheet-shaped metal substrate by using the plasma in accordance with the present invention.

FIG. 1 is a concept view illustrating a plasma polymerization device for manufacturing an ultra-hydrophilic air conditioning thin film coated metal product in accordance with the present invention. The plasma polymerization device of FIG. 1 continuously coats an anticorrosive Si—O group compound thin film on both surfaces of a sheet-shaped metal substrate, and continuously coats an ultra-hydrophilic Ti—O—C group compound thin film on both surfaces of the sheet-shaped metal substrate coated with the anticorrosive thin film. Here, the plasma polymerization device coats the anticorrosive thin film on the sheet-shaped metal substrate, and then coats the ultra-hydrophilic thin film thereon. Therefore, the plasma polymerization device sequentially coats the anticorrosive thin film and the ultra-hydrophilic thin film by using two coating chambers 2.

Vacuum pumps (not shown) for forming a vacuum inside the coating chambers 2 are connected to the coating chambers 2. As shown in FIG. 1, a metal sheet 8 is continuously supplied between electrodes 6 and 6a installed at the upper and lower portions. After an anticorrosive thin film and an ultra-hydrophilic titanium compound thin film are continuously sequentially coated on both surfaces of the metal sheet 8 by plasma generated between the electrodes 6 and 6a, the metal sheet 8 is discharged from the coating chambers 2. Power 10 and 10a is applied to the electrodes 6 and 6a.

Preferably, reactive gas cylinders 20 and 20a containing reactive gas that can form air or $O_2$ inject the reactive gas to the coating chambers 2 through valves 22 and 22a.

In addition, a liquid-phase titanium precursor that is liquid-phase titanium tetraisopropoxide [$Ti(OC_3H_7)_4$] and a liquid-phase silicon precursor that is liquid-phase HMDSO contained in containing vessels 30 and 30a pressurized by pressurizers 32 and 32a are injected into bubblers 40 and 40a through liquid-phase mass flow controllers (MFCs) 38 and 38a due to pressure differences. A gas-phase titanium precursor and a gas-phase silicon precursor bubbled by the bubblers 40 and 40a are injected into the coating members 2. Preferably, carrier gas that can form He, Ar or $N_2$ is injected through tubes between the liquid-phase MFCs 38 and 38a and the bubblers 40 and 40a, for helping the gas-phase titanium precursor and the gas-phase silicon precursor to be injected into the coating chambers 2. The carrier gas is contained in carrier gas cylinders 50 and 50a and injected into the tubes through valves 52 and 52a. Heater coils 42 and 42a are coiled around the bubblers 40 and 40a to heat and bubble the liquid-phase titanium precursor and the liquid-phase silicon precursor.

Here, the reactive gas, the gas-phase titanium precursor or the gas-phase silicon precursor and the carrier gas can be combined outside the coating chambers 2 and injected into the coating chambers 2 through each of tubes 60 and 60a as shown in FIG. 1, or can be injected into the coating chambers 2 through different tubes and combined inside the coating chambers 2 through one tube, respectively. Still referring to FIG. 1, the combining tubes 60 and 60a are connected through one-side holes of the coating chambers 2. Preferably, the mixed gas injected through the tubes 60 and 60a is discharged in the up/down direction of the coated metal sheet 8.

The gas-phase titanium precursor or the gas-phase silicon precursor is condensed at a low temperature. When the tubes 60 and 60a are maintained at a normal temperature, the gas-phase titanium precursor or the gas-phase silicon precursor is condensed on the inner walls of the tubes 60 and 60b. In order to prevent condensation of the gas-phase titanium precursor or the gas-phase silicon precursor, hot wires 64 and 64a are coiled around the outer walls of the tubes 60 and 60a through which the gas-phase precursor gas flows, for maintaining a predetermined temperature. Tubes 66 and 66a through which the liquid-phase titanium precursor or the liquid-phase silicon precursor flows is also formed in the same manner. That is, hot wires 68 and 68a are coiled around the outer walls of the tubes 66 and 66a, for maintaining a predetermined temperature, thereby preventing the titanium precursor or the silicon precursor from being condensed on the inner walls of the tubes 66 and 66a.

In this embodiment, the ultra-hydrophilic thin film is coated directly after the anticorrosive thin film is coated on the metal sheet. If necessary, the ultra-hydrophilic thin film can be coated according to a different process after the anticorrosive thin film is coated on the metal sheet (namely, after the sheet is unwound, the anticorrosive thin film is coated thereon, and the sheet is wound in a roll shape). In this case, one chamber can be used. In addition, an intermediate medium (for cooling) can be disposed between chambers, instead of consecutively installing the chambers.

In accordance with the present invention, the anticorrosive Si—O group compound thin film is continuously coated on the metal sheet 8 continuously supplied to the coating chamber 2 by using the plasma, and the ultra-hydrophilic Ti—O group compound thin film is continuously coated on the metal sheet 8 coated with the anticorrosive thin film by using the plasma. The thin film coated metal sheet 8 is mechanically processed into a target shape, for example, a fin of an air conditioning heat exchanger.

The ultra-hydrophilic metal sheet can be manufactured by using the plasma polymerization device. As mentioned above, the metal sheet is mechanically processed into the fin of the heat exchanger, and physical and surface properties thereof are measured and explained in the following examples. It must be recognized that the scope of the present invention is not restricted by the following examples but claims recited below.

EXAMPLES

Preparation of Plasma Coating Film

After $10^{-3}$ Torr of vacuum was formed in the coating chambers 2 by using the vacuum pumps, the metal sheets 8 were connected to anodes and maintained at a predetermined distance (30 to 150 mm) from the electrodes 6 and 6a, and the heater coils 42 and 42a of the bubblers 40 were electrically heated (80 to 120° C.) to bubble the liquid-phase precursors. The hot wires 64, 64a, 68 and 68a coiled around the outer walls of the tubes 60, 60a, 66 and 66a were electrically heated (80 to 120° C.) to prevent the titanium precursor and the silicon precursor from being condensed on the inner walls of the tubes 60, 60a, 66 and 66a. The gas-phase precursor gas, the carrier gas and the reactive gas were injected into the coating chambers 2 through the tubes, and discharged in the up/down direction of the metal sheet 8. When a target vacuum degree was obtained by the injected gas, power was turned on to generate the plasma by the mixed gas between the electrodes 6 and 6a consecutively formed in the flow direction of the metal sheet 8 in regard to the tubes 60 and 60a. Accordingly, an anticorrosive compound (Si—O—C group) thin film and an ultra-hydrophilic compound (Ti—O—C group) thin film were sequentially coated on both surfaces of the metal sheet 8.

In the plasma treatment, the current ranged from 0.1 to 0.5 A, the vacuum degree inside the chambers 2 ranged from 0.001 to 0.5 Torr, the injection amount of the gas-phase titanium precursor, the carrier gas and the reactive gas for forming the ultra-hydrophilic titanium compound thin film was 1000 sccm:800 sccm:1500 sccm, and the injection amount of the gas-phase silicon precursor, the carrier gas and the reactive gas for forming the anticorrosive thin film was 700 sccm: 700 sccm:70 sccm. The injection ratio of the reactive gas and the carrier gas for forming the anticorrosive thin film ranged from 1:10 to 1:20, and the injection ratio of the carrier gas and the gas-phase silicon precursor ranged from 1:1 to 1:2.

Figure 2:
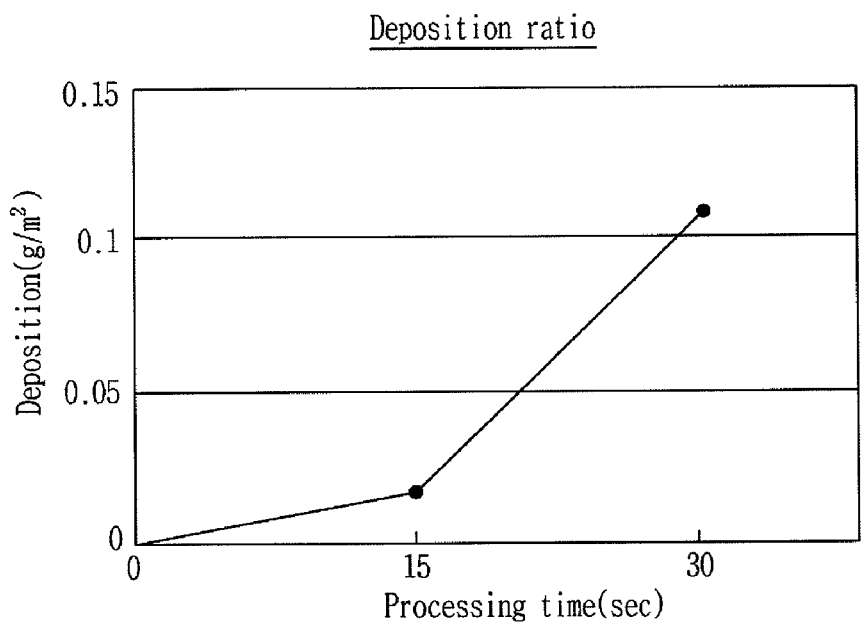
FIG. 2 is a graph showing a deposition ratio of the anticorrosive thin film by a plasma processing time in accordance with the present invention.

As illustrated in FIG. 2, the plasma processing time of the anticorrosive thin film increased, the deposition ratio thereof increased. Here, the deposition ratio of the thin film was obtained by measuring the weight of the metal sheet 8 or the sample before/after forming the thin film.

Figure 3:
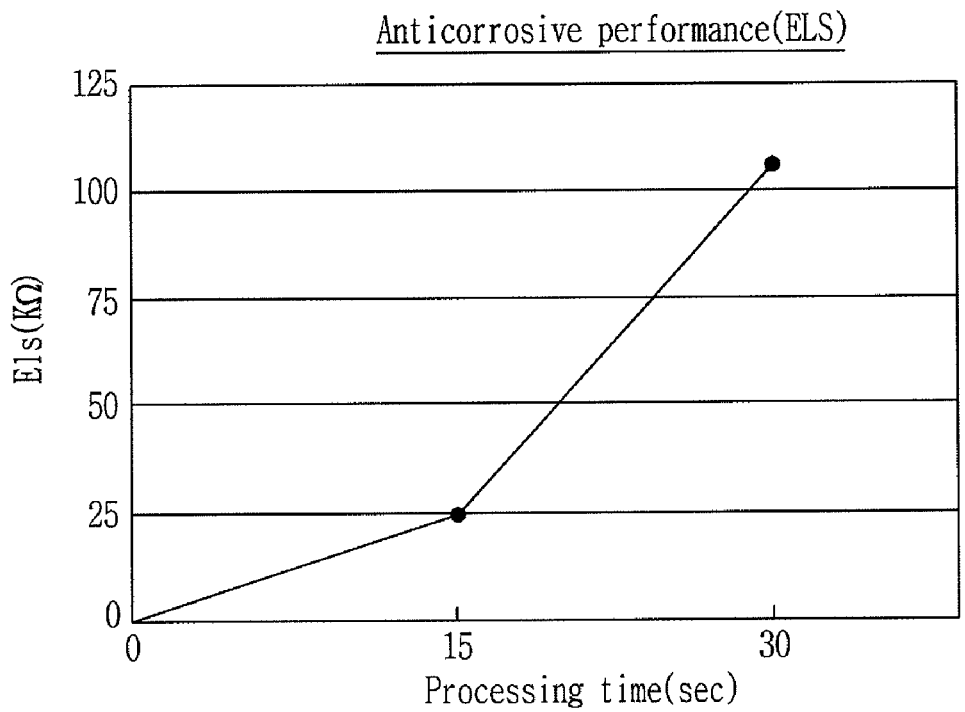
FIG. 3 is a graph showing anticorrosive performance of the anticorrosive thin film by the plasma processing time in accordance with the present invention.

As depicted in FIG. 3, the anticorrosive performance (EIS) of the anticorrosive thin film by the plasma processing time was proportional to the plasma processing time and the deposition ratio. Here, the anticorrosive performance was measured by using an EIS measuring device.

Figure 4:
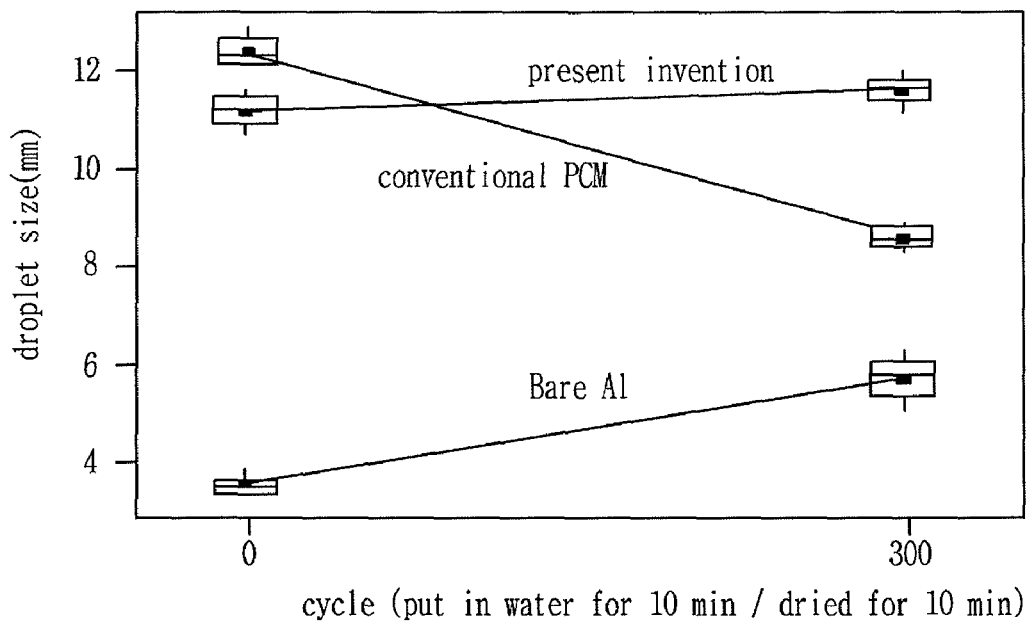
FIG. 4 is a graph showing a plasma formation ratio by a vacuum degree in plasma treatment of an ultra-hydrophilic thin film and an anticorrosive thin film in accordance with the present invention.

FIG. 4 shows variations of the anticorrosive performance by the vacuum degree. When the anticorrosive performance was measured in a vacuum degree of 0.2 Torr, 0.3 Torr and 0.5 Torr, the highest anticorrosive performance was obtained in a vacuum degree of 0.3 Torr.

Figure 5:
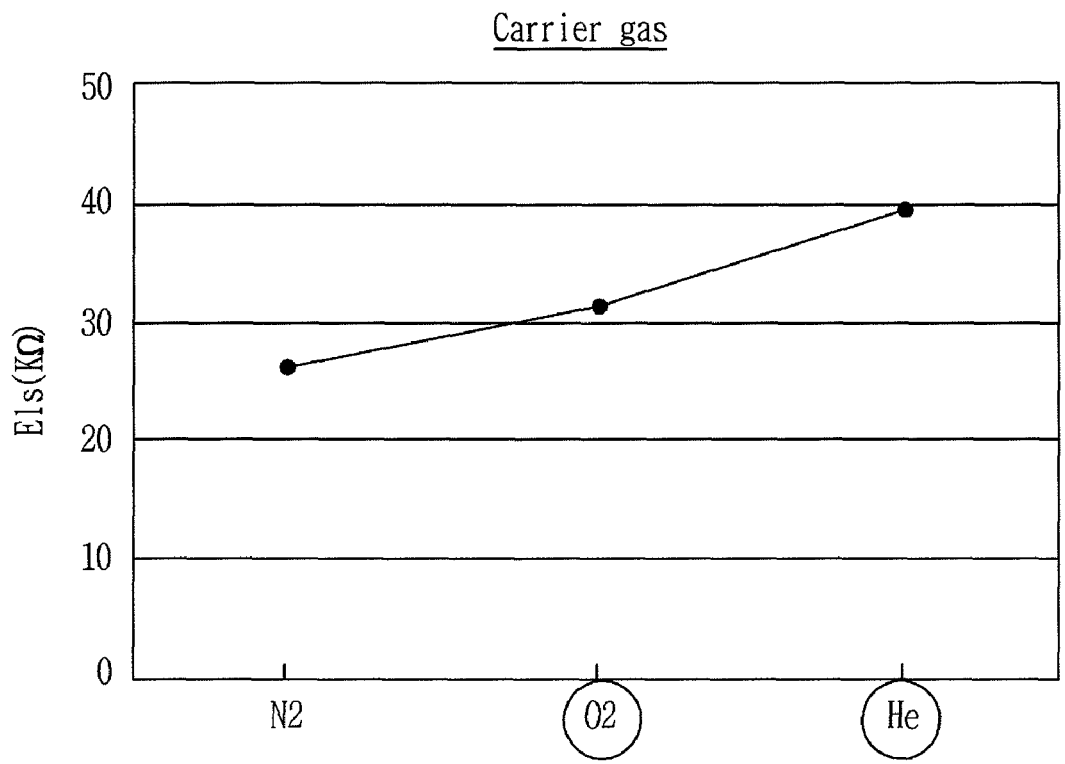
FIG. 5 is a graph showing a plasma formation ratio by carrier gas in plasma treatment of the ultra-hydrophilic thin film and the anticorrosive thin film in accordance with the present invention.

In addition, when the anticorrosive performance was measured by using the carrier gas (He, $N_2$, $O_2$) injected to form the anticorrosive thin film, respectively, as shown in FIG. 5, the highest anticorrosive performance was attained by using He as the carrier gas. In the plasma treatment, the deposition ratio of He was highest.

Analysis of Composition and Thickness of Coated Thin Film

Figure 6:
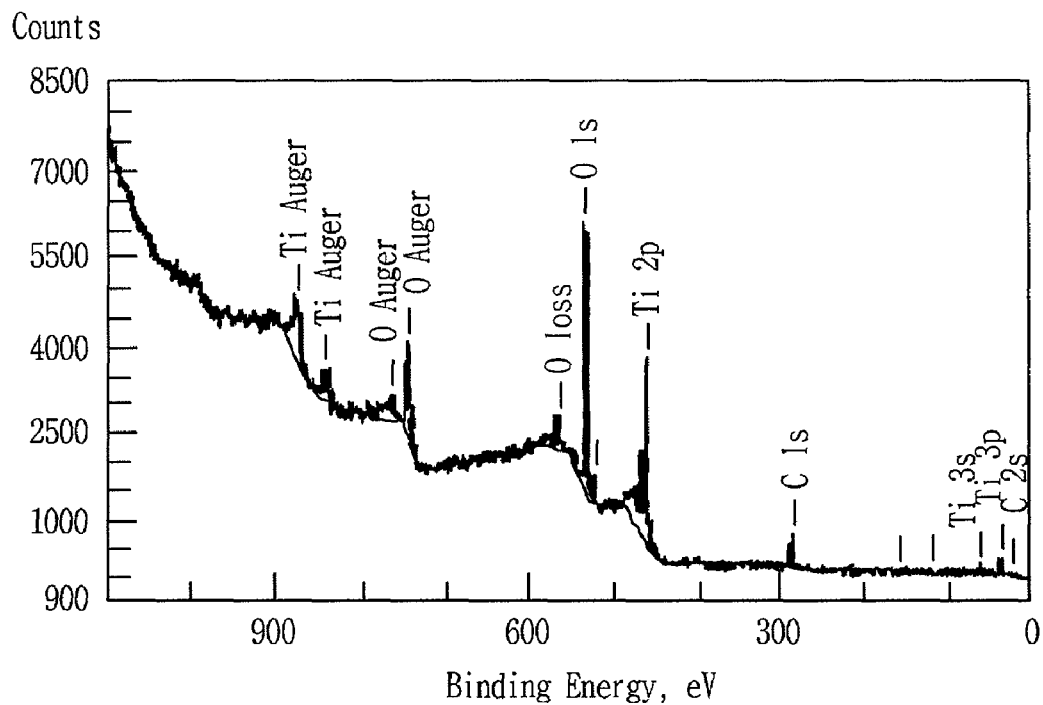
FIG. 6 is a graph showing XPS data for analyzing surface composition of a metal sheet coated with anticorrosive and ultra-hydrophilic thin films in accordance with the present invention.
Figure 7:
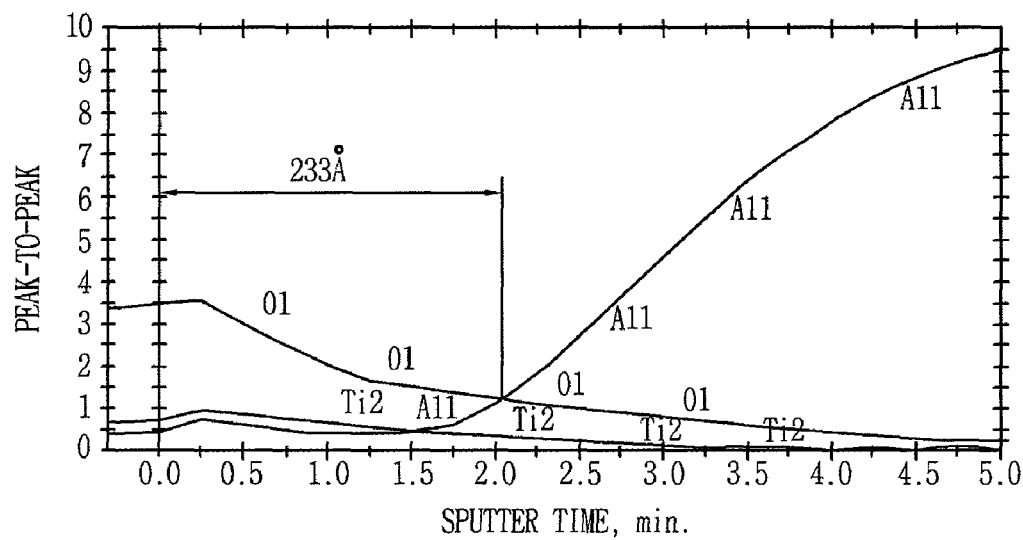
FIG. 7 is a graph showing AES data for analyzing thickness of the coated thin film in accordance with the present invention.

The composition of the processed thin film sample was analyzed according to X-ray photoelectric spectroscopy (XPS) for analogizing surface composition by measuring molecular specific absorption and emission wavelengths by using X-rays, and the thickness thereof was analyzed according to atomic emission spectrometry (AES) for analyzing composition by depth by performing sputtering at a fixed speed. FIGS. 6 and 7 show the analysis results.

FIG. 6 is a graph showing XPS data when a titanium compound thin film is formed after an HMDSO anticorrosive thin film. 19.4 atomic % of C, 58.3 atomic % of O, 2.5 atomic % of Si and 19.8 atomic % of Ti were analyzed. That is, the compound thin film was a Ti—Si—O—C group compound thin film.

In accordance with the analysis results, although slightly varied upon the conditions, the titanium compound thin film commonly contains 15 to 22 atomic % of Ti, 45 to 65 atomic % of O, and 20 to 25 atomic % of Si.

FIG. 7 is a graph showing representative AES data. As described above, the AES, that analyzes composition by depth by performing sputtering at a fixed speed, can analyze the thickness of the thin film. In the AES data of FIG. 7, the thickness of the thin film was 233 Å (23.3 nm). In accordance with the present invention, the thickness of the thin film was restricted between 100 Å and 1500 Å. Preferably, the thickness of the thin film ranged from 200 to 400 Å, and the total thickness of the ultra-hydrophilic titanium compound thin film and the anticorrosive silicon compound thin film ranged from 1 to 200 nm.

Figure 8:
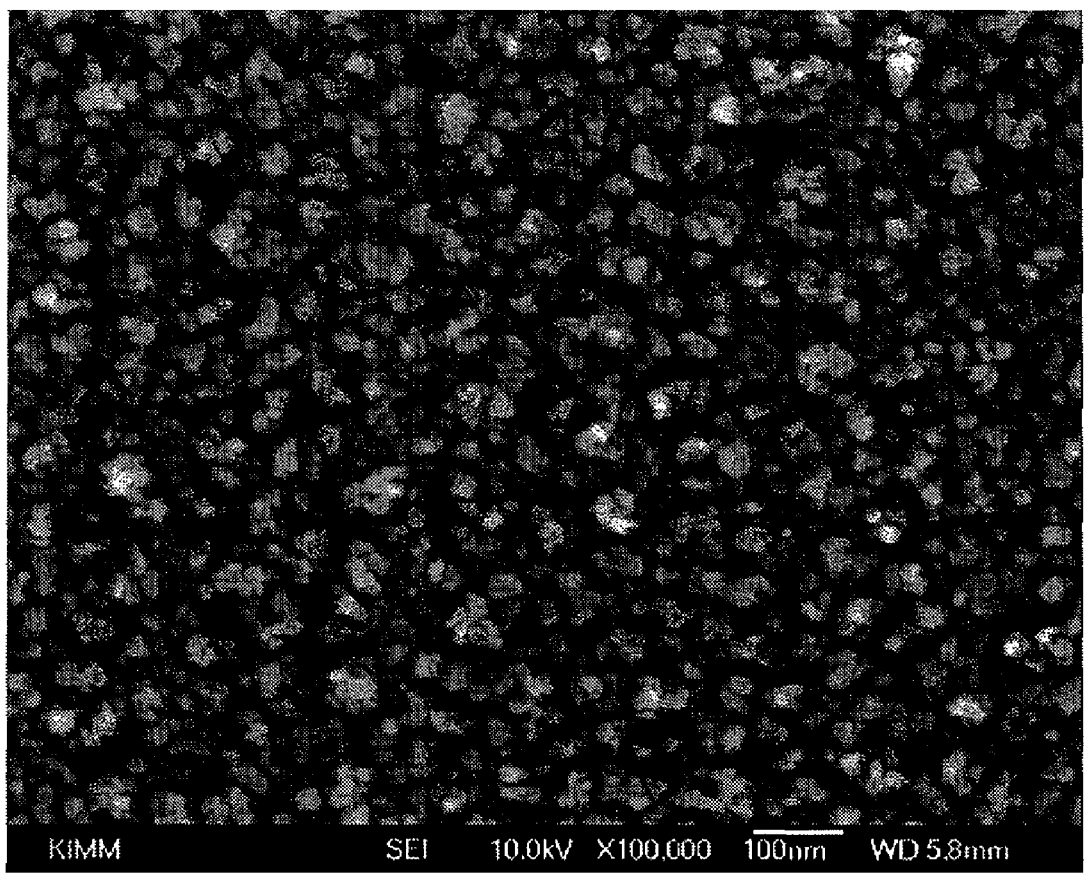
FIG. 8 is an SEM photograph showing the microstructure of the coated titanium compound thin film in accordance with the present invention.

FIG. 8 is an SEM photograph showing the Ti—Si—O—C group compound thin film in accordance with the present invention. As depicted in FIG. 8, a tight thin film was obtained.

Evaluation of Corrosion Resistance of Thin Film

Corrosion resistance was evaluated according to a salt spray test based on KS D9502 that was a method for evaluating corrosion resistance of metal materials, or metal materials using plating, organic coating films and inorganic coating films. The salt had a concentration of 5±1% and a temperature of 35±2° C. The corrosion resistance was evaluated on the basis of a pitting number observed with the naked eye.

As shown in Table 1, the non-coated Bare Al sheet showed the whole surface corrosion under the salt spray condition, namely, very low corrosion resistance, and the conventional PCM using wet coating had some corrosion pittings, namely relatively good corrosion resistance. In accordance with the present invention, the aluminum sheet coated with the titanium compound thin film had very excellent corrosion resistance. In the case that a silicon compound thin film was formed and a titanium compound thin film was coated thereon, the thin film showed extremely high corrosion resistance.

Figure 9A:
FIGS. 9a and 9b are photographs respectively showing surface states of the Bare Al sheet and the sheet coated with the anticorrosive and ultra-hydrophilic thin films after 15 days from the salt spray test.
Figure 9B:
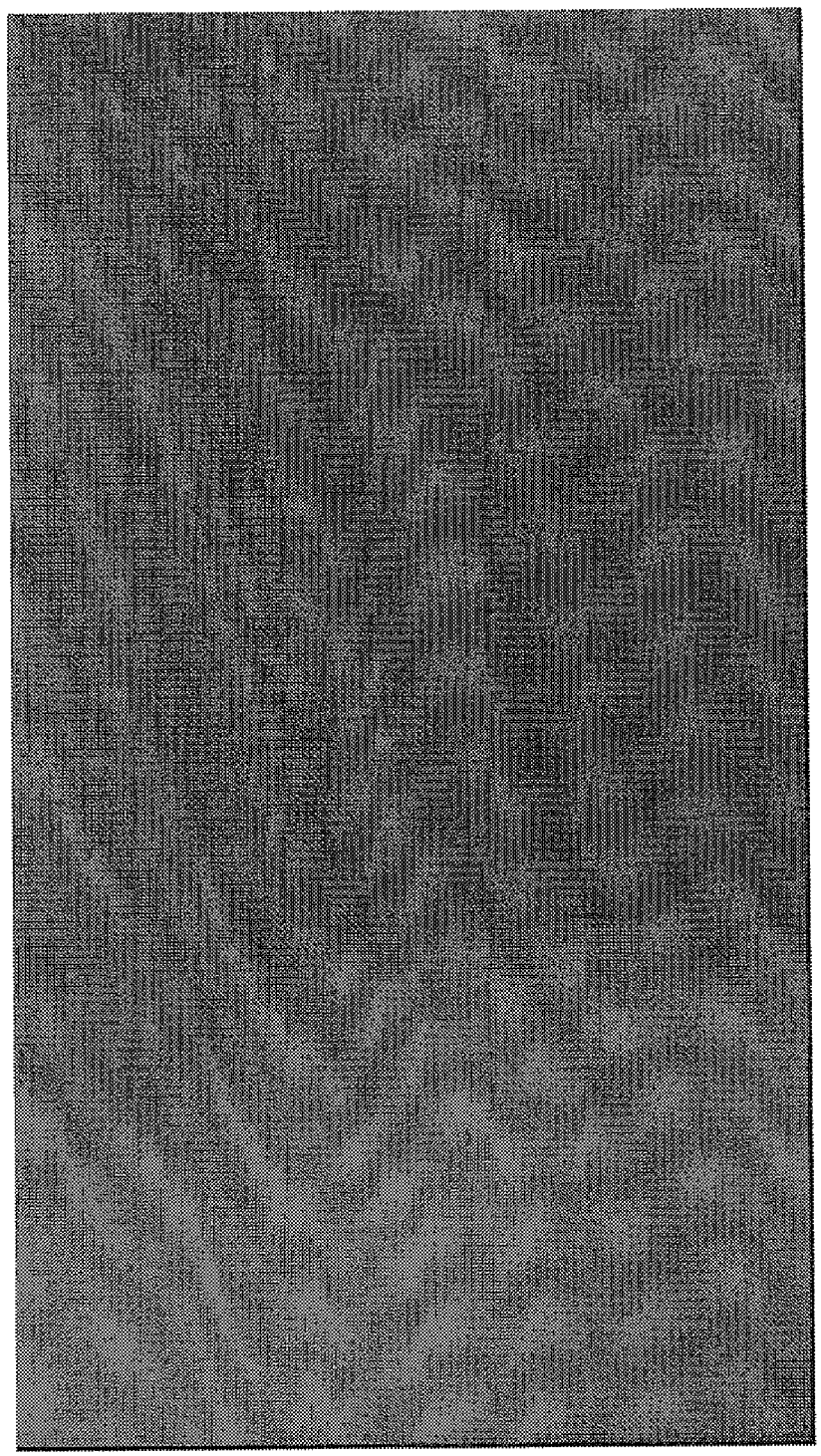

FIGS. 9a and 9b are photographs respectively showing surface states of the Bare Al sheet and the sheet coated with the anticorrosive thin film and the ultra-hydrophilic HMDSO+Ti compound thin film after 15 days from the salt spray test. As illustrated in FIGS. 9a and 9b, the Bare Al sheet had the whole surface corrosion, but the sheet coated with the anticorrosive and ultra-hydrophilic compound thin films had only 10 or less pittings, namely, extremely excellent corrosion resistance.

Hydrophilic and Aging Properties of Thin Film

Figure 10A:
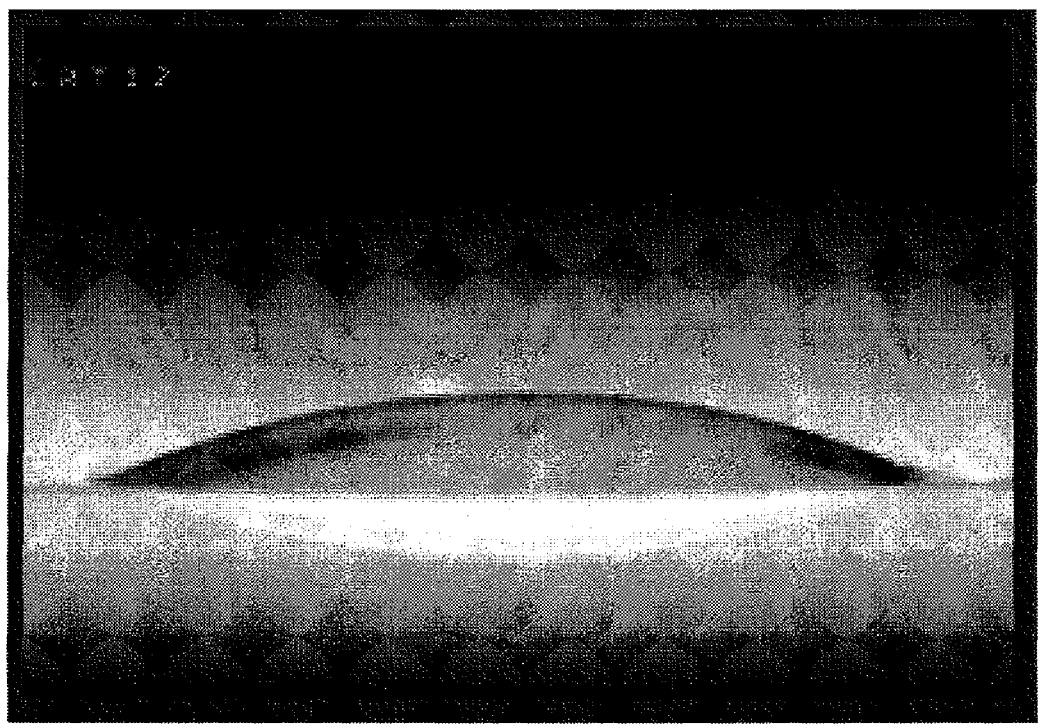
FIGS. 10a and 10b are photographs respectively showing dispersion of droplets when the surface is hydrophilic (FIG. 10a) and when the surface is hydrophobic (FIG. 10b) in a surface hydrophilicity/hydrophobicity test in accordance with the present invention.
Figure 10B:
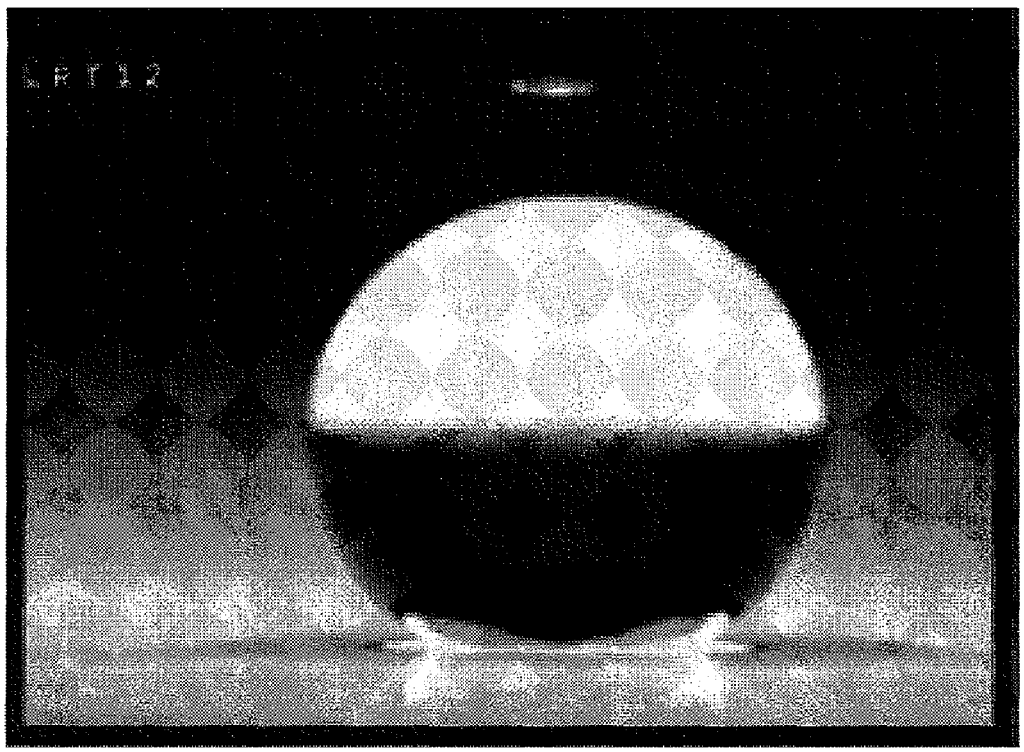

The hydrophilic performance was evaluated by dropping a fixed quantity of droplets (0.1 cc) from a height of 10 mm, and measuring a size of droplets on the surface of the sample. When the surface of the film was hydrophilic, the size of the droplets increased due to high dispersion, and when the surface of the film was hydrophobic, the size of the droplets decreased due to low dispersion. FIG. 10a shows the droplet formed on the hydrophilic surface. The size of the droplet ranged from 9 to 11 mm. FIG. 10b shows the droplet formed on the hydrophobic surface. The size of the droplet ranged from 2 to 3 mm.

Figure 11:
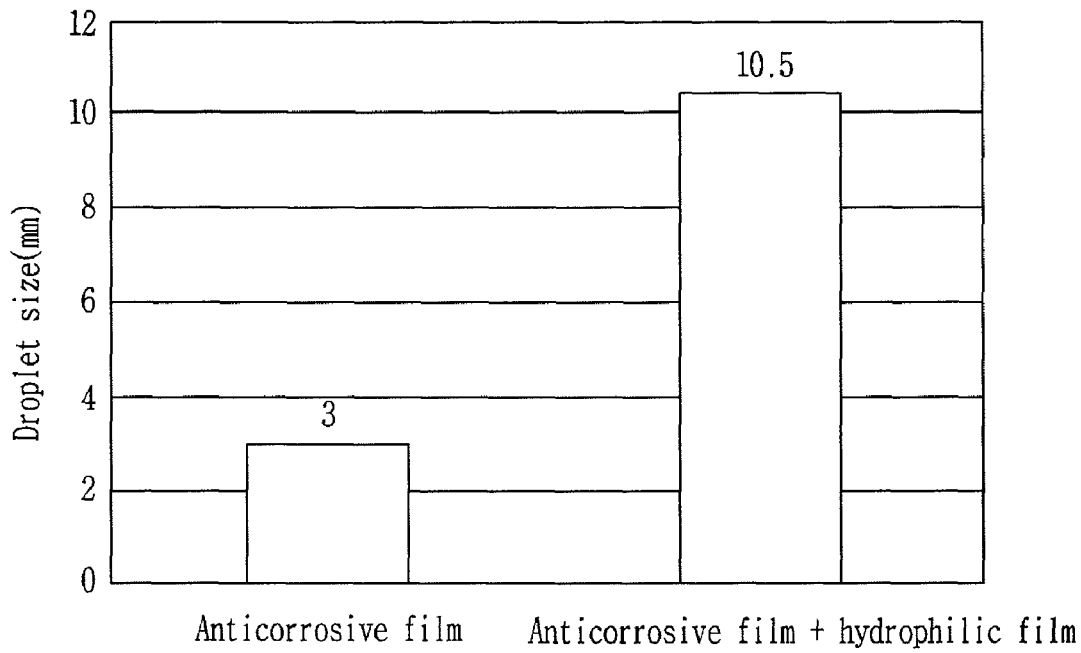
FIG. 11 is a graph showing aging properties of a sheet coated with an anticorrosive thin film and a sheet coated with anticorrosive and ultra-hydrophilic thin films.
Figure 12:
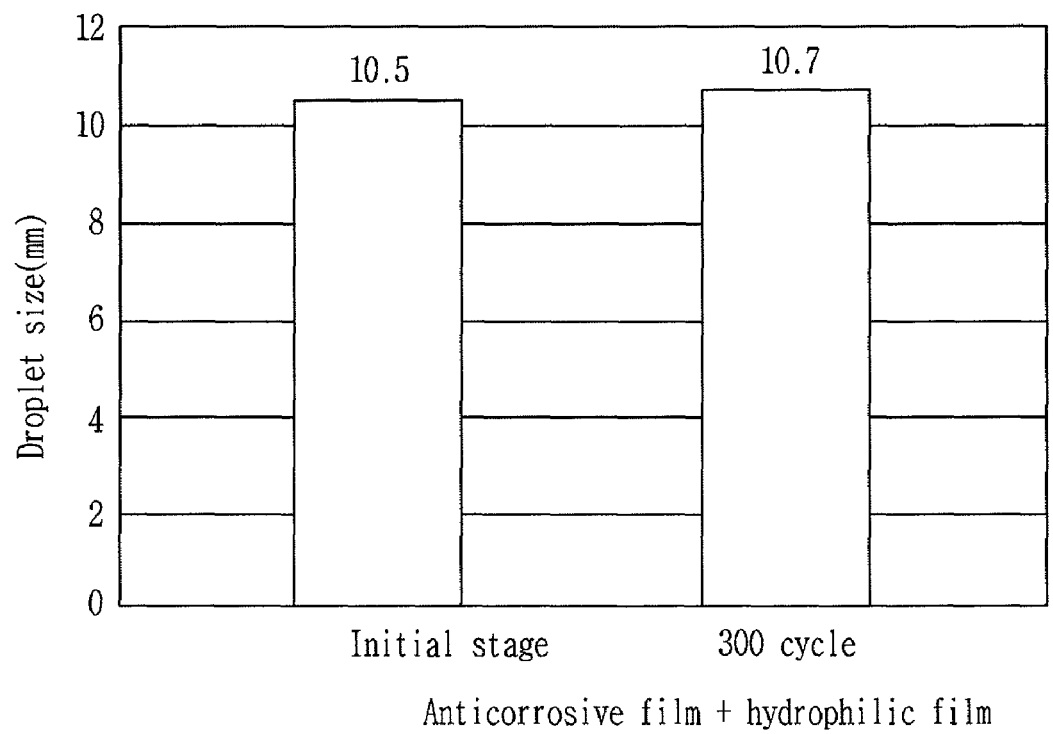
FIG. 12 is a graph showing an aging property of surface hydrophilicity by time/environment variations in a surface hydrophilicity/hydrophobicity test.

FIGS. 11 to 14 are graphs showing the above test results. FIG. 11 shows hydrophilic performance of an aluminum sheet sample coated with an anticorrosive film and an aluminum sheet sample coated with an anticorrosive film and an ultra-hydrophilic film. Here, the sample coated with the anticorrosive film was hydrophobic (about 3 mm), and the sample coated with the anticorrosive film and the ultra-hydrophilic film was hydrophilic (about 10.5 mm).

Referring to 12, in order to evaluate the aging property of hydrophilicity, the hydrophilic performance obtained after 300 cycles of cyclically putting the sample in distilled water for 10 minutes and drying the sample for 10 minutes was compared with the initial hydrophilic performance. The sample prepared by coating the hydrophilic film on the anticorrosive film was not changed in performance after 300 cycle accelerations.

TABLE 1

| | Evaluation of Corrosion Resistance by salt spray test | | | |
| --- | --- | --- | --- | --- |
| | | | Present invention | |
| Classifications | Bare Al | Conventional PCM | Ti—O—C group thin film | Ti—Si—O—C group thin film |
| 15 days after salt spray | Whole surface corroded | 10 | 2 | 0 |
| 30 days after salt spray | Whole surface corroded | 120 | 40 | 10 |
| Evaluation | Bad | Good | Very good | Very good |

Figure 13:
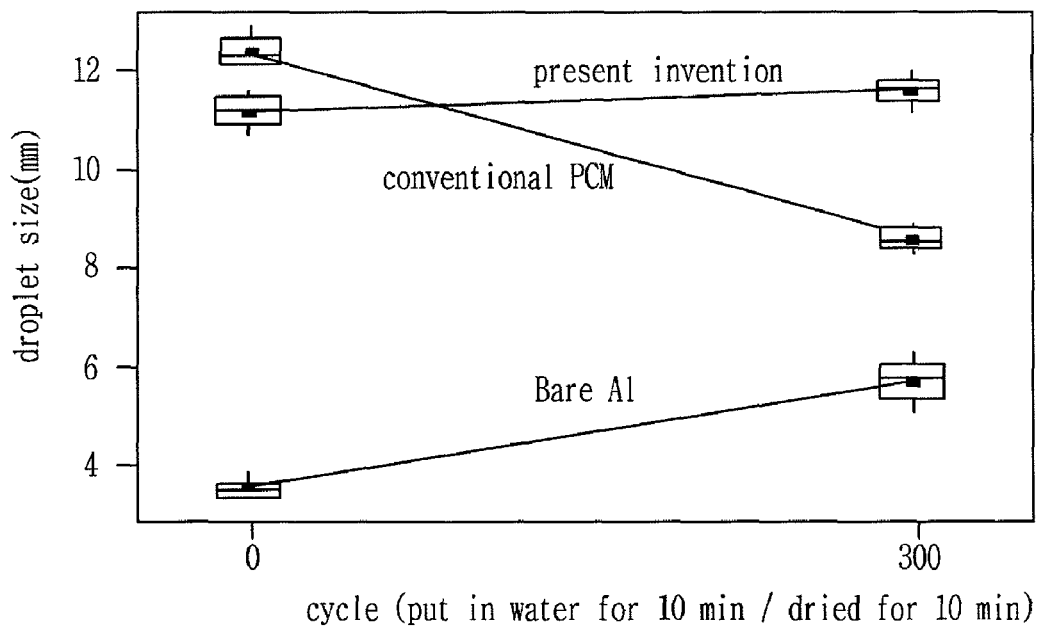
FIG. 13 is a graph showing aging properties of the Bare Al sheet, the conventional PCM sheet and the compound thin film coated sheet of the present invention.

As shown in FIG. 13, the hydrophilic performance of the thin film processed by the plasma was not changed after 300 cycle accelerations. On the other hand, the conventional PCM had excellent initial hydrophilic performance. However, as a surfactant that was a hydrophilic agent was dissolved in water, the hydrophilic performance of the conventional PCM was deteriorated. That is, the conventional PCM was aged. The Bare Al had a hydrophobic property at an initial stage. After accelerations, an $Al_2O_3$ layer was formed on the surface of the aluminum to slightly improve the hydrophilic performance.

Figure 14:
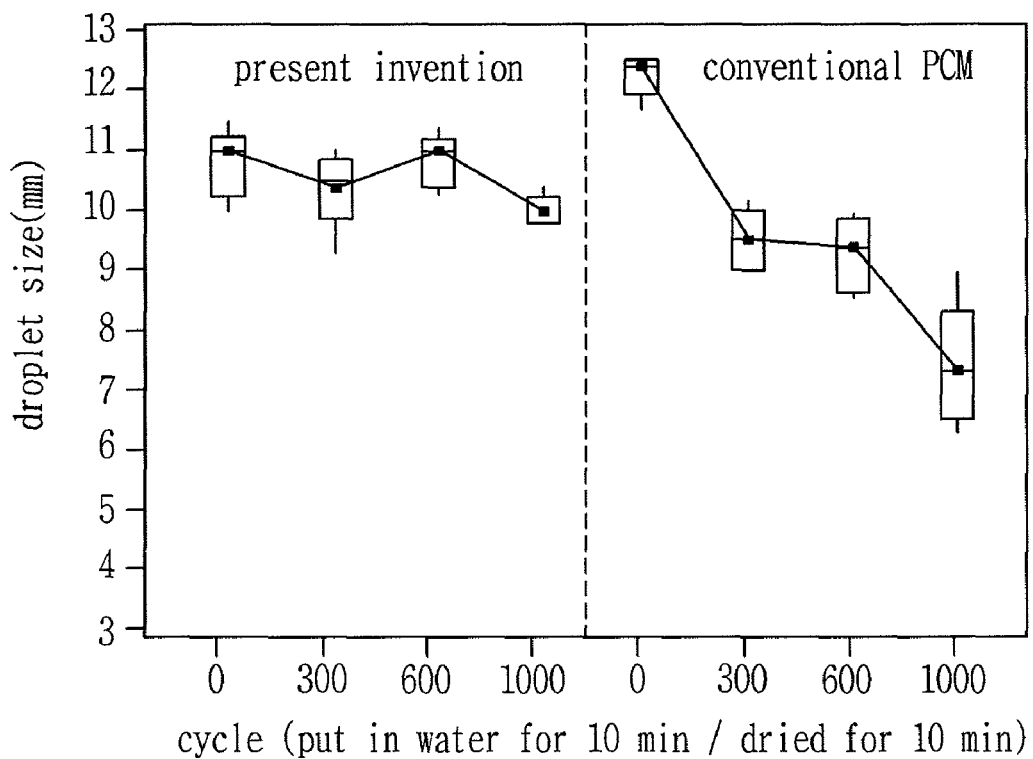
FIG. 14 is a graph showing aging properties of the compound thin film coated sheet of the present invention and the conventional PCM sheet.

FIG. 14 is a graph showing 1000 cycle aging test results of the titanium compound thin film of the present invention and the conventional PCM thin film. The thin film of the present invention maintained the hydrophilic performance (at least 9 mm of droplets). However, the hydrophilic performance of the conventional PCM thin film was sharply deteriorated according to increase of cycles.

ADVANTAGEOUS EFFECTS

As discussed earlier, in accordance with the present invention, the air conditioning metal material coated with the thin films having excellent hydrophilic performance, aging property and corrosion resistance can be easily produced on an industrial production scale.

In addition, the ultra-hydrophilic thin films can be uniformly formed on both surfaces of the sheet-shaped metal substrate.

Although the preferred embodiments of the present invention have been described, it is understood that the present invention should not be limited to these preferred embodiments but various changes and modifications can be made by one skilled in the art within the spirit and scope of the present invention as hereinafter claimed.

What is claimed is:

1. An ultra-hydrophilic thin film disposed on a metal substrate, said thin film consisting essentially of:
   an anticorrosive Si—O Group compound film disposed on the metal substrate, said anticorrosive film having a Si content of 20 to 25 atomic %, and
   a hydrophilic Ti—O—C—(H) compound film disposed on the anticorrosive film, said hydrophilic film having a Ti content of 15 to 22 atomic %, an O content of 45 to 65 atomic %, and one of a C content of 20 to 25 atomic %, and a H content of 20 to 25 atomic %.

2. The thin film coated metal substrate of claim 1, wherein an anticorrosive Si—O group compound thin film is coated on a surface of the metal substrate by using plasma and a hydrophilic Ti—O—(C)—(H) group compound thin film is sequentially coated on the surface on which the anticorrosive thin film has been coated, by using plasma.

3. The thin film coated metal substrate of claim 1, wherein the total thickness of the thin film ranges from 1 to 200 nm.

4. The thin film coated metal substrate of claim 1, wherein the metal substrate is an aluminum sheet.

5. The thin film coated metal substrate of claim 1 wherein the thin film coated metal substrate is mechanically machined.

6. The thin film coated metal substrate of claim 1, wherein the anticorrosive film and the hydrophilic film are disposed on the metal substrate as discrete layers.

7. A heat-exchanger provided with the ultra-hydrophilic thin film of claim 1.

* * * * *

UNITED STATES PATENT AND TRADEMARK OFFICE
CERTIFICATE OF CORRECTION

| | |
|---|---|
| PATENT NO. | : 7,901,786 B2 |
| APPLICATION NO. | : 12/543377 |
| DATED | : March 8, 2011 |
| INVENTOR(S) | : Su-Won Lee et al. |

It is certified that error appears in the above-identified patent and that said Letters Patent is hereby corrected as shown below:

ON THE TITLE PAGE:

At item (75), Inventors, correct the identification of the Inventors to read as follows:

-- (75) Inventors:  Young-Man Jeong, Ginhae-shi (KR);
Jung-Geon Oh, Changwon-shi (KR);
Hyun-Woo Jun, Changwon-shi (KR);
Su-Won Lee, Changwon-shi (KR);
Druk-Hyun Youn, Anyang-shi (KR) --.

Signed and Sealed this
Tenth Day of May, 2011

David J. Kappos
*Director of the United States Patent and Trademark Office*